United States Patent
Kim et al.

(10) Patent No.: US 8,470,142 B2
(45) Date of Patent: Jun. 25, 2013

(54) SPUTTERING APPARATUS AND DRIVING METHOD THEREOF

(75) Inventors: Sung Eun Kim, Woolsan-si (KR); Tae Hyun Lim, Gyeongsangbuk-do (KR); Hwan Kyu Yoo, Gyeonggi-do (KR); Kwang Jong Yoo, Gyeonggi-do (KR); Yang Sik Moon, Gyeonggi-do (KR); Byeong Cheol An, Daegu-si (KR)

(73) Assignees: LG Display Co., Ltd., Seoul (KR); AVACO Co., Ltd., Daegu-si (KR); LG Electronics, Inc., Seoul (KR)

( * ) Notice: Subject to any disclaimer, the term of this patent is extended or adjusted under 35 U.S.C. 154(b) by 1290 days.

(21) Appl. No.: 11/451,440

(22) Filed: Jun. 13, 2006

(65) Prior Publication Data

US 2006/0278522 A1    Dec. 14, 2006

(30) Foreign Application Priority Data

Jun. 13, 2005  (KR) .................. 10-2005-0050258

(51) Int. Cl.
*C23C 14/34*  (2006.01)

(52) U.S. Cl.
USPC ............ 204/192.13; 204/192.12; 204/298.03; 204/298.11; 204/298.25

(58) Field of Classification Search
USPC ............ 204/192.12, 192.13, 298.03, 298.11, 204/298.25
See application file for complete search history.

(56) References Cited

U.S. PATENT DOCUMENTS

| 4,315,960 A * | 2/1982 | Ohji et al. ........... 427/248.1 |
| 4,434,042 A * | 2/1984 | Keith ................. 204/298.09 |
| 5,269,899 A * | 12/1993 | Fan ................... 204/298.09 |
| 2001/0008208 A1 * | 7/2001 | Futagawa et al. ...... 204/298.09 |

FOREIGN PATENT DOCUMENTS

| JP | 02-080564 | * | 3/1990 |
| JP | 05-106039 A | | 4/1993 |
| JP | 2000-256846 | * | 9/2000 |
| JP | 2001-335930 | * | 12/2001 |
| KR | 1020040039554 A | | 5/2004 |

OTHER PUBLICATIONS

Machine Translation of 2000-256846 dated Sep. 2000.*

* cited by examiner

*Primary Examiner* — Rodney McDonald
(74) *Attorney, Agent, or Firm* — Morgan, Lewis & Bockius LLP

(57) ABSTRACT

A sputtering apparatus for depositing a target material on a substrate includes a chamber, a target in the chamber to provide the target material, a carrier to carry the substrate in the chamber to face the target, and a plurality of masks arranged along sides of the carrier and being movable back and forth with respect to the carrier.

14 Claims, 4 Drawing Sheets

SPUTTERING APPARATUS AND DRIVING METHOD THEREOF

This application claims the benefit of the Korean Patent Application No. 2005-50258 filed in Korea on Jun. 13, 2005, which is hereby incorporated by reference.

BACKGROUND OF THE INVENTION

1. Field of the Invention

The present invention relates to a sputtering apparatus, and more particularly, to a sputtering apparatus and a method of driving the sputtering apparatus that are capable of achieving an optimum deposition.

2. Background of the Related Art

In general, a sputtering apparatus typically deposits a target material on a substrate by colliding ions accelerated in plasma with a target. As compared to a chemical vapor deposition (CVD) apparatus that performs processes at a high temperature, the sputtering apparatus is advantageous in performing a sputtering process where a thin film can be formed while a substrate is maintained at a low temperature of about 400° C. Such a sputtering apparatus has been widely utilized for a flat panel display device such as a liquid crystal display (LCD) device, an organic electroluminescence device, or the like because of its simple structure and formation of a deposition layer in a short period of time.

The conventional sputtering apparatus has a cathode connected to a target, which is provided in a chamber, and an anode connected to a substrate. When a predetermined voltage is applied between the cathode and the anode, electrons are bombarded with an inert gas and are thus ionized. When the ionized positive ions are accelerated toward the cathode target and collide with the target, a target material is sputtered from the target, thereby depositing the target material on the substrate to form a predetermined layer. The electrons are excited by bombarding neutral atoms to thereby generate plasma. The plasma is maintained when an external potential is maintained and electrons are continuously generated.

The sputtering apparatus may be classified into a cluster type and an in-line type. FIG. 1 is a schematic cross-sectional view illustrating a cluster type-sputtering apparatus according to the related art. As shown in FIG. 1, the related art cluster type sputtering apparatus includes a chamber 100 that serves to accommodate a substrate 110 transferred from the outside, a lifter 120 that is able to be placed upright to support the substrate 110, a target 130 including a target material to be deposited onto the substrate 110, and a mask 140 arranged in front of the target 130. Specifically, the substrate 110 is transferred horizontally into the chamber 100 and mounted on the lifter 120. Then, the lifter 120 carrying the substrate 110 is lifted upright in the chamber 100, and a sputtering process is thus performed. This sputtering apparatus is advantageous in that the degree to which the vacuum and temperature change is minimized because the lifter 120 constantly maintains the vacuum and certain temperature. Also, a gap of about 5 mm between the mask 140 and the substrate 110 within the chamber 100 can be maintained, thereby minimizing the deposition of the target material from the target 130 onto the lifter 120 supporting the substrate 110. However, such a cluster type sputtering apparatus cannot perform a deposition process for a large-sized substrate, which is greater than 2 m×2 m, due to the weight of equipment and an increase in pump capacity.

Recently, an in-line type sputtering apparatus has been increasingly utilized to perform the deposition process for large-sized substrates. FIG. 2A is a plan view schematically illustrating an in-line type sputtering apparatus according to the related art. FIG. 2B is a cross-sectional view schematically illustrating the in-line type sputtering apparatus within a chamber. As shown in FIGS. 2A and 2B, the related art in-line sputtering apparatus has a carrier 220 to transfer a substrate 210 into a chamber 200. Then, unlike the aforementioned cluster type lifter 120, the carrier 220 is not placed upright within the chamber 200, but is moved in a direction perpendicular to a mask 240 of the chamber 200 to transfer the substrate 210 to a region facing a target 230, thereby depositing a target material from the target 230 onto the substrate 210.

However, even though the related art in-line type sputtering apparatus is suitable for the deposition process on a large-sized substrate, it is difficult to adjust a gap between the substrate 210 and the mask 240 to be smaller than 10 mm, because the carrier 220 is moved vertically to transfer the substrate 210 to a region facing the target material 230. In other words, when the substrate 210 and the carrier 220 are moved vertically, they may be bent due to thermal deformation or the like, thereby causing a variation of an error range in uniformity of the substrate 210 and the carrier 220. If the carrier 220 and the substrate 210 are transferred to the region facing the target material 230 regardless of such a variation, the substrate 210 and the mask 240 may have a gap greater than 10 mm in one region and smaller than 10 mm in another region, and may even contact each other. In the event that the substrate 210 and the mask 240 contact each other, the substrate 210 may be scratched by the mask 240 and thus contaminated, or the substrate 210 may be damaged by a collision with the mask 240. Moreover, in the related art in-line sputtering apparatus, since the substrate 210 and the mask 240 have the gap as wide as approximately 10 mm, particles generated by a back sputtering contaminate the carrier 220.

SUMMARY OF THE INVENTION

Accordingly, the present invention is directed to a sputtering apparatus and a method of driving the same that substantially obviate one or more problems due to limitations and disadvantages of the related art.

An object of the present invention is to provide a sputtering apparatus and a driving method thereof capable of preventing particle contamination caused due to a contact between a mask and a carrier by maintaining a uniform gap therebetween regardless of deformation of a substrate.

Another object of the present invention is to provide a sputtering apparatus and a driving method thereof capable of preventing particle contamination caused due to back sputtering by minimizing a gap between a mask and a carrier.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided a sputtering apparatus for depositing a target material on a substrate, which includes a chamber, a target including the target material in the chamber, a carrier to carry substrate into the chamber to face the target, and a plurality of masks arranged along sides of the carrier in the chamber and being movable back and forth with respect to the carrier.

In another aspect of the present invention, there is provided a method of driving a sputtering apparatus including a target for a target material, a carrier to carry a substrate to face the target in a chamber, and a plurality of masks arranged along sides of the carrier and being movable back and forth with respect to the carrier. The method includes transferring the carrier and the substrate in the chamber to face the target, moving the carrier and the substrate toward the target, moving each of the plurality of masks toward the carrier, and performing a sputtering process, thereby depositing the target material from the target onto the substrate.

In a further another aspect of the present invention, there is provided a sputtering apparatus for depositing a target material on a substrate, which includes a carrier to carry the substrate, a first chamber to measure a bending degree to which the carrier bends, and a second chamber including a target for the target material, a plurality of masks arranged along sides of the carrier and being movable back and forth with respect to the carrier, and a plurality of moving units to move the plurality of masks, wherein the plurality of masks are each movable individually depending on the bending degree of the carrier.

In a still further another aspect of the present invention, there is provided a method of driving a sputtering apparatus including a first chamber to measure a degree to which a carrier carrying a substrate bends, and a second chamber including a target for a target material, a plurality of masks arranged along sides of the carrier and being movable back and forth with respect to the carrier, and a plurality of moving units to move the plurality of masks, respectively. The method includes measuring the bending degree to which the carrier bends when the carrier and the substrate are transferred in the first chamber, transferring the carrier carrying the substrate from the first chamber to the second chamber, wherein the carrier is moved to face the target, moving the carrier toward the target, and moving each of the plurality of masks toward the carrier depending on the bending degree of the carrier.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE PREFERRED EMBODIMENTS

Reference will now be made in detail to the preferred embodiments of the present invention, examples of which are illustrated in the accompanying drawings. Wherever possible, the same reference numbers will be used throughout the drawings to refer to the same or like parts.

Figure 3A:
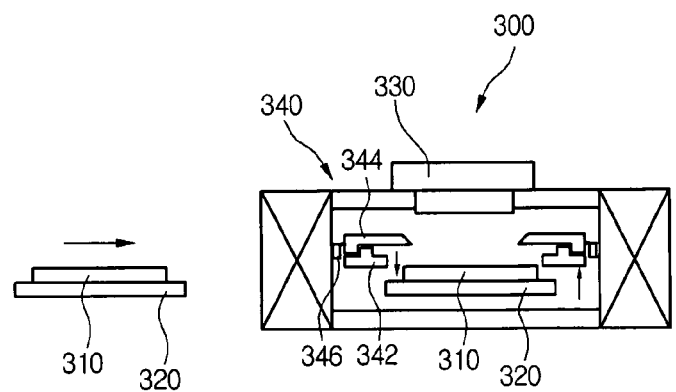
FIG. 3A is a plan view schematically illustrating an in-line type sputtering apparatus according to an exemplary embodiment of the present invention.
Figure 3B:
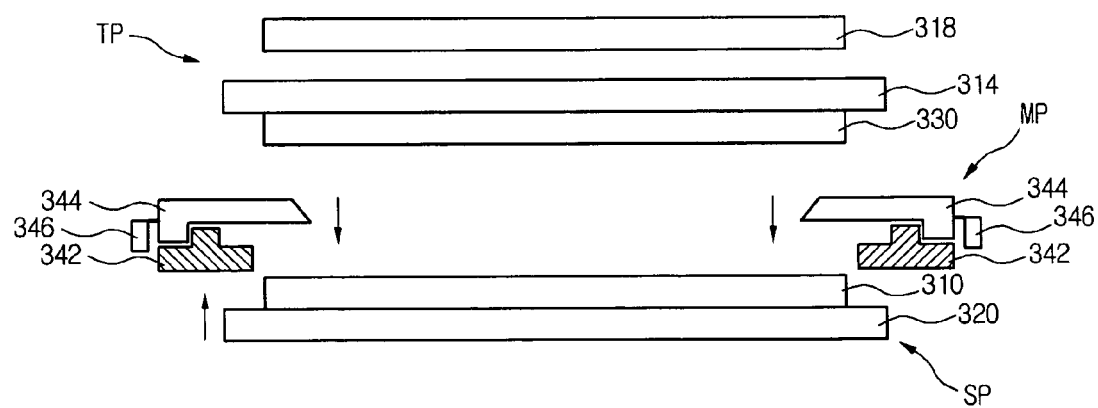
FIG. 3B is a cross-sectional view schematically illustrating an in-line type sputtering apparatus within a chamber according to the exemplary embodiment of the present invention.

FIG. 3A is a plan view schematically illustrating an in-line type sputtering apparatus according to an exemplary embodiment of the present invention, and FIG. 3B is a cross-sectional view schematically illustrating the in-line type sputtering apparatus of FIG. 3B. As shown in FIG. 3A, the in-line type sputtering apparatus of the exemplary embodiment has a carrier 320 to transfer a substrate 310 into a process chamber 300. Then, unlike the aforementioned cluster type lifter 120, the carrier 320 is not placed upright within the process chamber 300, but is moved in a direction perpendicular to a mask part MP of the chamber 300 to transfer the substrate 310 to a region facing a target 330, thereby depositing a target material from the target 330 onto the substrate 310.

Figure 1:
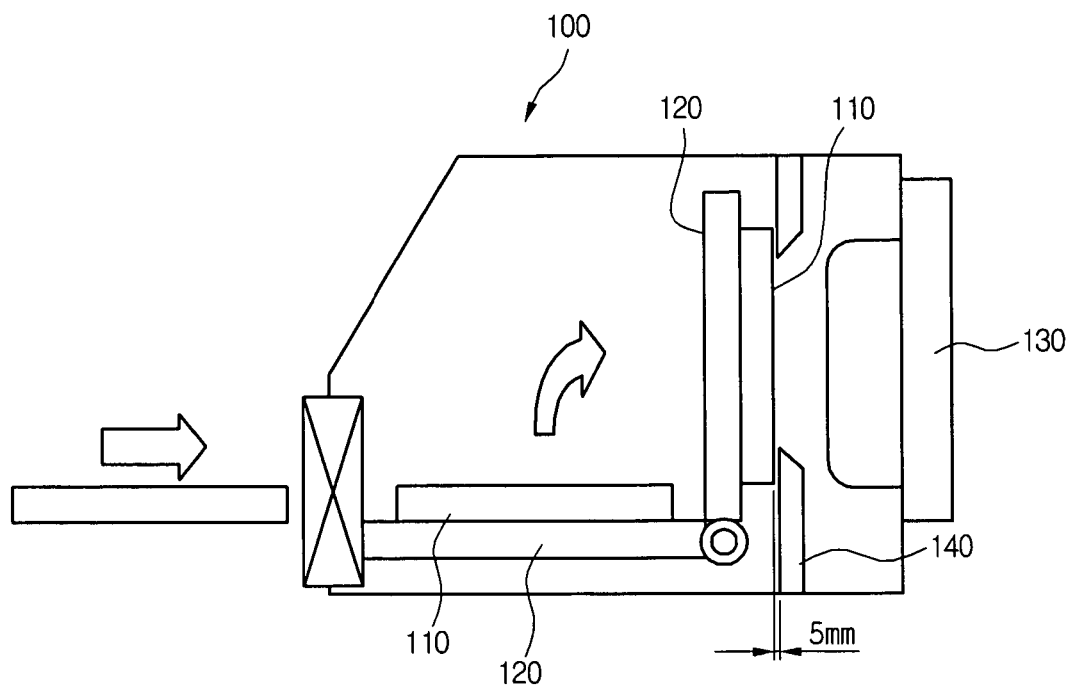
FIG. 1 is a schematic cross-sectional view illustrating a cluster type sputtering apparatus according to the related art.
Figure 2A:
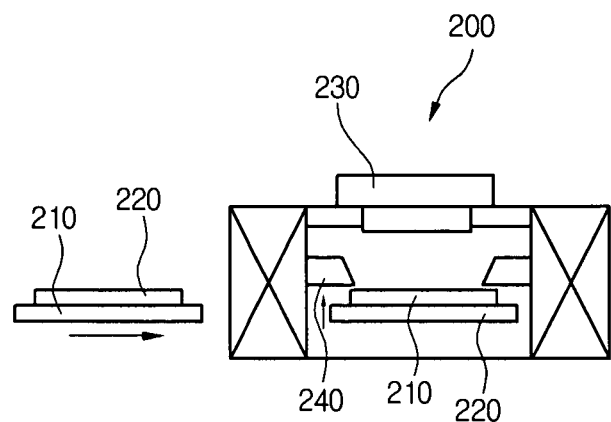
FIG. 2A is a plan view schematically illustrating an in-line type sputtering apparatus according to the related art.
Figure 2B:
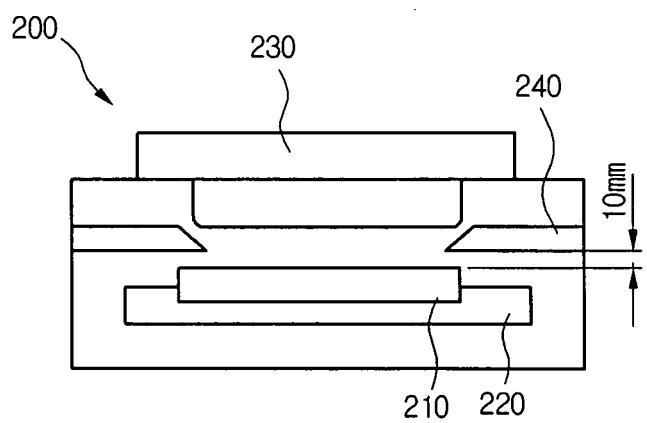
FIG. 2B is a cross-sectional view schematically illustrating the related art in-line type sputtering apparatus within a chamber.
Figure 4:
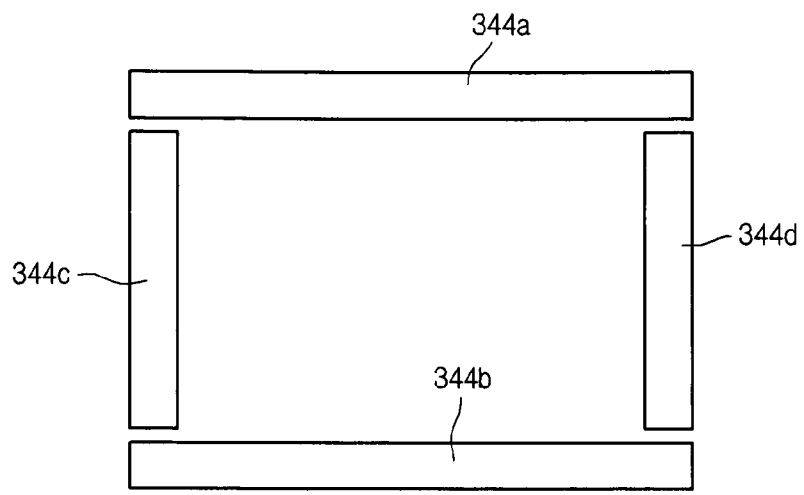
FIG. 4 is a view schematically illustrating an exemplary arrangement of floating masks of FIGS. 3A and 3B.

According to this exemplary embodiment, the mask part MP includes a mask 342, a plurality of floating masks 344 and a plurality of floating mask moving units 346. After the completion of the vertical transfer of the carrier 320 in the process chamber 300, the floating masks 344 may be moved toward the carrier 320, thereby reducing a gap between the floating masks 344 and the carrier 320 as compared to the related art in-line type of FIGS. 2A and 2B. Moreover, FIG. 4 schematically illustrates an exemplary arrangement of the plurality of floating masks 344 of FIG. 3. As shown in FIG. 4, the floating masks 344 may further include first, second, third and fourth floating masks 344a, 344b, 344c and 344d. In this exemplary embodiment, the four floating masks 344a to 344d are provided on four separated sides of the mask 342, respectively. Alternatively, fewer or more floating masks may be used.

Referring to FIG. 3B, the process chamber 300 of the exemplary sputtering apparatus includes a substrate part SP, a target part TP, and the mask part MP. As shown in FIG. 3B, the target part TP includes a rear plate 314, the target 330 attached to the rear plate 314, and a magnet 318 provided behind the rear plate 314. The magnet 318 supplies a magnetic field to prevent electrons generated in the plasma from undesirably coming out of a plasma generation region. The rear plate 314 serves to fix the target 330 that includes a target material to be deposited onto the substrate 310 by a sputtering process. Moreover, a cathode (not shown) may be provided between the target 330 and the rear plate 314. The rear plate 314 may also serve as the cathode.

The substrate part SP includes the substrate 310 onto which the target material from the target 330 is to be deposited by the sputtering process, and the carrier 320 carrying the substrate 310. An anode (not shown) may be provided between the substrate 310 and the carrier 320. The carrier 320 may also serve as the anode.

As discussed above, the mask part MP includes the mask 342, the floating masks 344 (e.g., 344a to 344d), and the floating mask moving units 346. The mask 342 is fixedly connected to the chamber 300. The floating masks 344a to 344d are arranged corresponding to the four sides of the masks 342, respectively, and are movable back and forth (i.e., backward and forward). The floating masks 344 are moved by the floating mask moving unit 346. In this exemplary embodiment, as shown in FIG. 3B, the forward direction is toward the carrier 320, and the backward direction is away form the carrier 320.

When the process of transferring the carrier 320 and the substrate 310 is finished, the carrier 320 is moved toward the target 330. In this exemplary embodiment, the substrate 310 and the mask part MP have a gap of approximately 10 mm therebetween. A separate moving unit may be provided to move the carrier 320 toward the target 330. Moreover, the floating mask moving units 346 may include first to fourth moving units, which correspond to the first to fourth floating masks 344a to 344d of FIG. 4, respectively. Moreover, the floating masks 344a to 344d may be individually driven or may be driven all together at the same time by the corresponding first to fourth moving units, respectively. According to such an arrangement of the exemplary embodiment, when the substrate 310 and the carrier 320 are bent due to thermal deformation, the floating masks 344a, 344b, 344c and 344d are separately adjusted to have the same gaps with the substrate 310 despite of the uniformity variations due to the bending of the substrate 310.

The carrier 320 transferred and fixed to a region facing the target 330 is moved toward the target 330, and the floating masks 344 are moved toward the carrier 320 by the floating mask moving unit 346, thereby reducing a gap between the floating masks 344 and the carrier 320 as compared to the related art. For example, the gap between the floating masks 344 and the substrate 310 according to the exemplary embodiment is approximately 5 mm, whereas the gap between the mask and the substrate according to the related art is approximately 10 mm.

In the exemplary embodiment of the present invention, the gap between the floating masks 344 and the substrate 310 is reduced in the aforementioned manner, thereby preventing particle contamination due to the back sputtering. Also, a certain amount of gap therebetween is maintained, thereby avoiding the occurrence of particle contamination due to a contact between the floating masks 344 and the substrate 310. Moreover, in the exemplary embodiment, a stable plasma generation system may be implemented in an in-line sputter by minimizing undesirable vibrations of the carrier 320 at the time of transfer thereof.

The floating mask moving units 346 may be driven by a motor or the like, thereby moving the respective floating masks 344. Also, the floating mask moving units 346 may be controlled individually or together by a control unit (not shown) provided in the mask part MP. Moreover, the mask 342 may be formed in a quadrangular frame shape of a conductive material such as aluminum (Al) or the like, and generates plasma by maintaining the potential difference with the target 330 serving as a cathode. The floating masks 344 may be formed of a conductive material such as aluminum (Al) and may be electrically insulated from the mask 342.

When the sputtering process is finished and the target material from the target 330 is deposited on the substrate 310 in a state where the floating masks 344 have been moved toward the substrate 310, the floating masks 344 move back to their initial positions so that the floating masks 344 and the substrate 310 are spaced apart again by approximately 10 mm. Moreover, individual carriers may have different bending degrees depending on assembly differences, vacuum, thermal impact, or the like.

Figure 5:
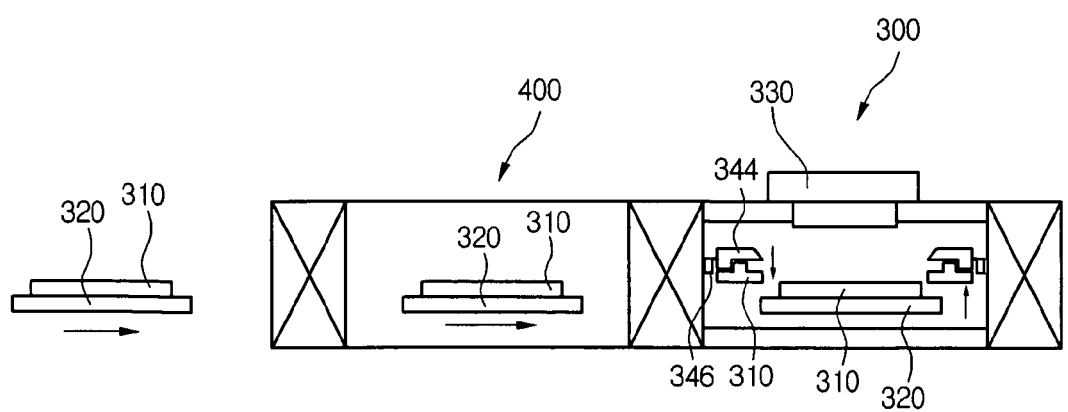
FIG. 5 is a plan view schematically illustrating an in-line type sputtering apparatus according to another exemplary embodiment of the present invention.

FIG. 5 is a plan view schematically illustrating an in-line type sputtering apparatus according to another exemplary embodiment of the present invention. As shown in FIG. 5, unlike the embodiment of FIG. 3A, the in-line type sputtering apparatus according to this exemplary embodiment further includes a load chamber 400 in front of the process chamber 300 in which the sputtering is performed.

The load chamber 400 is provided with a carrier-bending measuring unit (not shown) that measures the degree to which a carrier 320 transferring a substrate 310 bends before the sputtering. That is, since a plurality of carriers 320 have different properties including different bending degrees, the bending degree of each carrier 320 is measured before the sputtering process. Accordingly, when the floating masks 344a to 344d are moved toward the carrier 320, the degrees to which the floating masks 344a to 344d provided on the four sides of the mask 342 move are individually controlled. Herein, each carrier 320 may be identified by, for example, a bar code provided to the carrier 320.

After the bending degree of the carrier 320 is measured in the load chamber 400 and the carrier 320 is transferred into the process chamber 300, the remaining processes are the same as those illustrated in FIG. 3B, and therefore, the detailed description thereon is omitted.

According to the exemplary embodiment of FIG. 5, when the floating masks 344a to 344d are moved toward the carrier 320, the floating masks 344a to 344d may be moved to different degrees in consideration of the bending degree of the carrier 320. That is, the floating-mask moving units 346 within the process chamber 300 are provided to correspond to the respective floating masks 344a to 344d, and are separately moved by a control unit provided in the mask part MP depending on the measured bending degree of the carrier 320.

As described so far, according to the exemplary embodiments of the present invention, a gap between a mask and a carrier within an in-line sputtering apparatus can be reduced, thereby preventing a target material from being unnecessarily deposited on the carrier and also avoiding contamination of the chamber and vibrations of transferring the carrier. Accordingly, a stable plasma generation system can be achieved in the in-line sputtering apparatus of the present invention.

It will be apparent to those skilled in the art that various modifications and variations can be made in the sputtering apparatus and the method of driving the sputtering apparatus of the present invention. Thus, it is intended that the present invention covers the modifications and variations of this invention provided they come within the scope of the appended claims and their equivalents.

What is claimed is:

1. A sputtering apparatus for depositing a target material on a substrate, comprising:
   a carrier to carry the substrate;
   a first chamber to measure a bending degree to which the carrier bends; and
   a second chamber including a target for the target material, a plurality of masks arranged along sides of the carrier and being movable back and forth with respect to the carrier, and a plurality of moving units to move the plurality of masks, respectively,
   wherein the plurality of masks are each movable individually depending on the bending degree of the carrier.

2. The apparatus according to claim 1, wherein the carrier is movable back and forth with respect to the target.

3. The apparatus according to claim 1, further comprising a moving unit to move the carrier.

4. The apparatus according to claim 1, wherein the plurality of masks include first to fourth masks that are arranged along the sides of the carrier.

5. The apparatus according to claim 1, further comprising a plurality of moving units that move the plurality of the masks, respectively.

6. The apparatus according to claim 5, wherein the plurality of moving units include first to fourth moving units that are connected to the plurality of masks, respectively.

7. The apparatus according to claim 5, wherein the plurality of masks are movable individually.

8. The apparatus according to claim 5, wherein the plurality of masks are movable at the same time.

9. The apparatus according to claim 1, wherein, after each of the plurality of masks is moved, a gap between each of the plurality of masks and the substrate is approximately 5 mm.

10. A method of driving a sputtering apparatus including a first chamber to measure a degree to which a carrier carrying a substrate bends, and a second chamber including a target for a target material, a plurality of masks arranged along sides of the carrier and being movable back and forth with respect to the carrier, and a plurality of moving units to move the plurality of masks, respectively, the method comprising:

measuring the degree to which the carrier bends when the carrier with the substrate are transferred in the first chamber;

transferring the carrier with the substrate from the first chamber to the second chamber, wherein the carrier is moved to face the target;

moving the carrier toward the target;

moving each of the plurality of masks toward the carrier depending on the bending degree of the carrier; and performing a sputtering process, thereby depositing the target material from the target onto the substrate.

11. The method according to claim 10, wherein the plurality of masks are movable individually.

12. The method according to claim 10, wherein the plurality of masks are movable at the same time.

13. The method according to claim 10, wherein, after each of the plurality of masks and the carrier are moved, a gap between each of the plurality of masks and the substrate is approximately 5 mm.

14. The method according to claim 10, further comprising moving each of the plurality of masks away from the carrier and moving the carrier away from the target after a predetermined process.

* * * * *